United States Patent [19]
Gross

[11] Patent Number: 4,868,636
[45] Date of Patent: Sep. 19, 1989

[54] POWER THYRISTOR

[75] Inventor: Wolfgang Gross, Unterföhring, Fed. Rep. of Germany

[73] Assignee: Siemens Aktiengesellschaft, Berlin and Munich, Fed. Rep. of Germany

[21] Appl. No.: 211,157

[22] Filed: Jun. 22, 1988

Related U.S. Application Data

[63] Continuation of Ser. No. 919,199, Oct. 15, 1986, abandoned.

[30] Foreign Application Priority Data

Oct. 15, 1985 [DE] Fed. Rep. of Germany ....... 3536726

[51] Int. Cl.[4] .................. H01L 21/447; H01L 23/48; H01L 23/54
[52] U.S. Cl. ........................................ 357/71; 357/79; 357/38; 357/59; 357/81
[58] Field of Search ................. 357/71, 80, 79, 68, 357/59, 38, 81

[56] References Cited

U.S. PATENT DOCUMENTS 4,096,623  6/1978  Prost et al. .

FOREIGN PATENT DOCUMENTS 0064231  11/1982  European Pat. Off. .
0077930   5/1983  European Pat. Off. .
2847853   7/1979  Fed. Rep. of Germany .
3329241   2/1985  Fed. Rep. of Germany .
2075910  10/1971  France .
2254879   7/1975  France .

Primary Examiner—Rolf Hille
Assistant Examiner—S. V. Clark
Attorney, Agent, or Firm—Herbert L. Lerner; Laurence A. Greenberg

[57] ABSTRACT

A power thyristor includes a semiconductor body having first and second main surfaces, the first main surface being planar; at least first and second metal electrodes disposed at least on the first main surface; the first electrode having a contact surface lying in a first plane parallel to the first main surface; the second electrode having a contact surface lying in a second plane parallel to the first main surface; the contact surface of the first electrode being further from the first main surface than the contact surface of the second electrode; the first electrode being formed of first and second layers and the second electrode being formed of a metal with a given thickness; the first layer being adjacent the first main surface and being formed of polycrystalline silicon; and said second layer being disposed on the first layer and being formed of the same metal with the same given thickness as the second electrode.

7 Claims, 2 Drawing Sheets

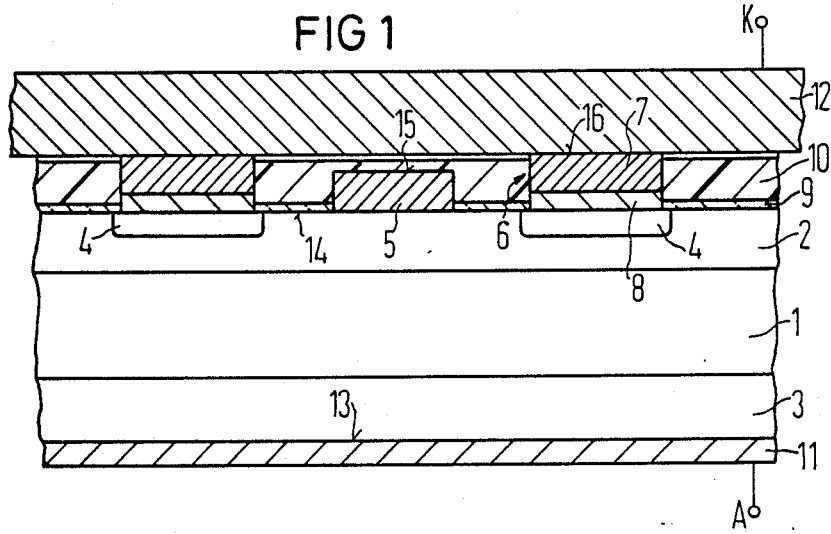
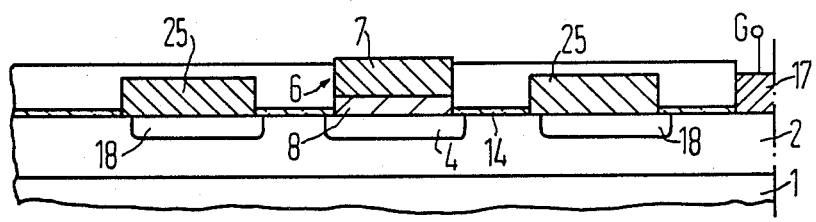
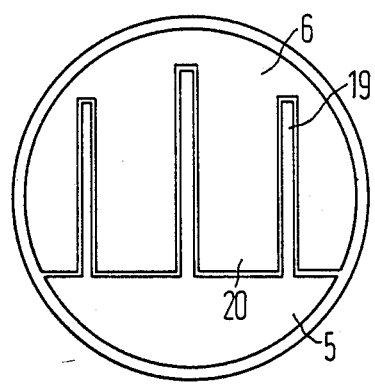
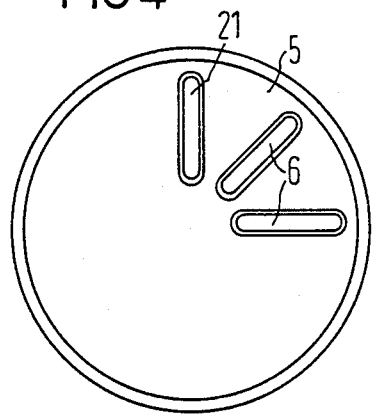

POWER THYRISTOR

This application is a continuation, of application Ser. No. 919,199, filed Oct. 15, 1986, now abandoned.

SPECIFICATION

The invention relates to a power thyristor with a semiconductor body having the following features:

(a) the semiconductor body has two main or principal surfaces provided with metal electrodes;

(b) at least two electrodes are disposed on at least one of the main surfaces;

(c) the contact surface of a first of the two electrodes lies in a first plane parallel to the one main surface;

(d) the contact surface of a second of the two electrodes lies in a second plane parallel to the one main surface;

(e) the one main surface is planar; and (f) the contact surface of the first electrode is farther from the main surface than the contact surface of the second electrode. Such a power thyristor has been described, for instance, in German Patent DE-PS 24 31 506, corresponding to U.S. Pat. No. 4,096,623. The thyristor described therein has internal firing amplification, i.e., an auxiliary emitter and a main emitter. The main emitter and the auxiliary emitter are provided with respective first and second electrodes. The auxiliary emitter electrode is thinner than the main emitter electrode, so that the main emitter electrode can be contacted in a simple manner by a planar contact electrode on the cathode side, without touching the auxiliary emitter electrode.

The smaller thickness of the auxiliary emitter electrode is achieved by first applying a continuous metal layer on the semiconductor body; then structuring the electrodes; and then etching the metal of the auxiliary emitter electrode to make it thinner. This requires a multiplicity of masking steps. In addition, such a device has the disadvantage of not reducing the shunt conductivity of the auxiliary emitter electrode. In addition, the etching of metal layers is not simple, because in this case relatively heavy underetching of the etching mask takes place. This, however, imposes a limitation to relatively coarse structures.

It is accordingly an object of the invention to provide a power thyristor which overcomes the hereinafore-mentioned disadvantages of the heretofore-known devices of this general type and to do so in such a manner that the different heights of the above-mentioned contact surfaces can be provided in a simpler manner. In addition, the preparation of substantially finer structures than that which was heretofore possible should be provided without great effort.

With the foregoing and other objects in view there is provided, in accordance with the invention, a power thyristor, comprising a semiconductor body having first and second main or principal surfaces, the first main surface being planar; at least first and second metal electrodes disposed at least on the first main surface; the first electrode having a contact surface lying in a first plane parallel to the first main surface; the second electroe having a contact surface lying in a second plane parallel to the first main surface; the contact surface of the first electrode being further from the first main surface than the contact surface of the second electrode; the first electrode being formed of first and second layers and the second electrode being formed of a metal with a given thickness; the first layer being adjacent the first main surface and being formed of polycrystalline silicon; and the second layer being disposed on the first layer and being formed of the same metal with the same given thickness as the second electrode.

In accordance with another feature of the invention, the metal is aluminum.

In accordance with a further feature of the invention, there is provided a polyimide insulating layer covering the first main surface, covering the second electrode, and surrounding the first electrode leaving the contact surface of the first electrode free.

In accordance with an added feature of the invention, the first electrode is in the form of a plurality of mutually spaced apart coherent fingers and a portion of the second electrode is disposed between the fingers.

In accordance with an additional feature of the invention, the first electrode is formed of a multiplicity of mutually separated island-shaped regions.

In accordance with yet another feature of the invention, the polycrystalline silicon layer is doped.

In accordance with a concomitant feature of the invention, there is provided an emitter zone, the polycrystalline silicon layer being a dopant source or agent for the emitter zone.

Other features which are considered as characteristic for the invention are set forth in the appended claims.

Although the invention is illustrated and described herein as embodied in a power thyristor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a fragmentary, diagrammatic, cross-sectional view of a first embodiment of the power thyristor according to the invention;

FIG. 2 is a view similar to FIG. 1 of a second embodiment according to the invention;

FIGS. 3 and 4 are top-plan views of two electrode configurations of the device according to FIG. 1.

Figure 5:
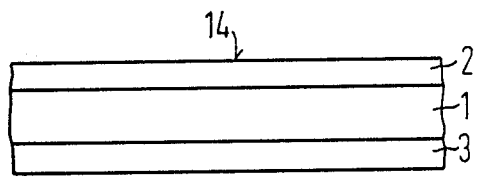
FIGS. 5 to 10 are fragmentary, side-elevational views on a smaller scale, illustrating essential process steps for producing the device according to FIG. 1.

Referring now to the figures of the drawings in detail and first, particularly, to FIG. 1 thereof, there is seen a semiconductor body of a power thyristor having a central zone 1 which is adjoined by a base zone 2 on the cathode side and an emitter zone 3 on the anode side. The semiconductor body has a main or principal surface 13 on the anode side and a main or principal surface 14 on the cathode side. An emitter zone 4 is embedded in a planar manner or mode in the main surface 14 on the cathode side. The zones 4 and 2 are provided with a first electrode 6 and a second electrode 5, respectively. A contact surface 16 of the first electrode 6 is farther removed from the main surface 14 than a contact surface 15 of the second electrode 5. The first electrode 6 has two layers 7, 8. The first layer 8 which is applied to the main surface 14, is formed of polycrystalline silicon and may be 5 to 10 μm thick, for instance. The second layer 7 which is applied to the first layer 8, is formed of the same metal as the second electrode 5 and has the same thickness. The layer 7 may be formed of aluminum, for instance. Otherwise, the main layer 14 is covered by a silicon dioxide layer 9.

The first electrode 6 forms the cathode electrode of the power thyristor and is contacted by a lead-in electrode 12 on the cathode side. The lead electrode is planar on the side facing the semiconductor body. Contact between the lead-in electrode 12 and the electrode 5 forming the gate electrode is avoided by the smaller thickness of the electrode 5 as compared to the electrode 6. Since the polysilicon layer 8 only has a thickness of between 5 and 10 $\mu$m, there is only a spacing of 5 to 10 $\mu$m between the electrode 5 and lead-in electrode 12. Since a potential difference of, for instance, 20 V exists between the electrodes 5 and 6, this distance is sufficient for insulation. However, it is advisable, especially in the case of pressure contacts, to cover the electrode 5 and the space between the electrodes 5 and 6 with an insulating layer 10. A photoimide which has been found to be suitable as an insulating material for this purpose, is commercially available under the name "Selectilux HTR 3" from the firm Merck. The layer 10 is provided with a thickness which leaves the contact surface of the electrode 6 free and only surrounds the electrode 6 at the rim.

The power thyristor according to FIG. 1 may be a GTO (gate turn off) thyristor, for instance. In such a thyristor, the width of the emitter zone 4 as well as the spacing of the individual emitter zone parts from each other must be as small as possible. This can prevent the GTO thyristor from being fired again while cleaning out the stored charge. The recovery time can also be shortened in this way.

Various embodiments of the construction of the electrodes 5 and 6 are shown in FIGS. 3 and 4. For the sake of improved clarity, the presentation of these figures is considerably less detailed. In the embodiment according to FIG. 3, the first and second electrodes 6, 5 are finger-shaped and are disposed in such a way that fingers 19 and 20 thereof mesh. The fingers 19, 20 remain connected to each other mechanically and electrically, via a four set spacing of 5-10 mm between electrodes 5 and 12.

In the embodiment according to FIG. 4, the emitter electrodes 6 are in the form of island-shaped regions in recesses 21 in the gate electrode 5. The electrodes 6 are separated from each other mechanically as well as electrically and are only connected to each other electrically by the lead-in electrode 12. The islands can be in the form of strips or dots.

The invention is not limited to a GTO thyristor but instead can also be used, for instance, for a thyristor with internal firing amplification which is shown in FIG. 2. In FIG. 2 reference symbols which are identical to those used in FIG. 1 designate the same parts. The thyristor according to FIG. 2 additionally has auxiliary emitter zones 18 which are embedded in the main surface 14 of the thyristor, like the emitter zones 4. The auxiliary emitter 18 is provided with an auxiliary emitter electrode 25. The zone 2 is provided with an electrode 17 which forms a gate terminal G.

Figure 6:
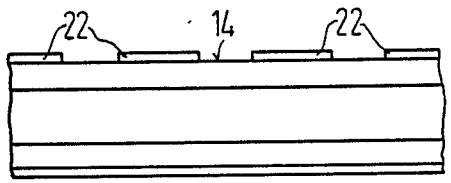
Figure 7:
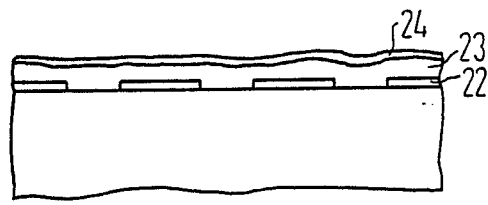

The GTO thyristor can be produced by a simple process which is shown with the aid of clearly defined process steps in FIGS. 5 to 10. The semiconductor body is first subjected to a basic diffusion process, in which zones 1, 2 and 3 are generated, as shown in FIG. 5. Subsequently, the surface of the semiconductor body is oxidized and structured on the main surface 14 on the cathode side, silicon dioxide layers 22 being left standing, as shown in FIG. 6. In the next step, a layer 23 of polycrystalline silicon is deposited on the cathode side. This is advantageously accomplished by a CVD process. After the deposition of the polycrystalline silicon layer having a thickness of 5 to 10 $\mu$m, its surface is covered by a doping substance, for instance phosphorus, so that a continuous phosphorus layer 24 is generated, as shown in FIG. 7.

Figure 8:
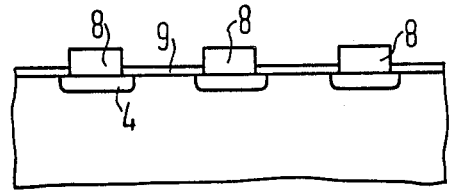
Figure 9:
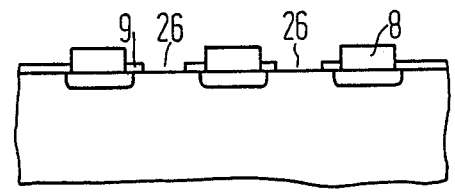
Figure 10:
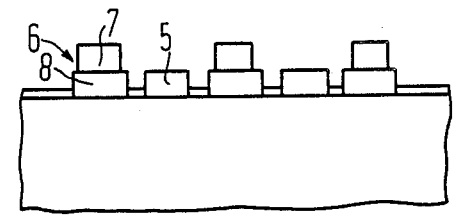

Subsequently, the polycrystalline silicon layer 23 is structured by a lithographic technique, in such a manner that the polycrystalline silicon is only preserved in the parts covered by the dioxide layers 22. The polycrystalline silicon layer forms the first layer 8 of the emitter contacts in those locations, as seen in FIG. 8. Subsequently, the phosphorus of the layer 24 is diffused into the semiconductor body and forms the emitter zones. Then, openings 26 are generated in the silicon dioxide layer 8, as shown in FIG. 9; the openings are intended for the second electrodes 5.

As the next step, an aluminum layer is applied to the cathode side; it is deposited on the first layer 8 of the first contacts as well as in the openings 26. The second layers 7 of the first contacts 6 and the second contacts 5 are structured by a further photostep.

The structures can be made very fine, so that the lateral dimensions of the emitters and their distances from each other can be in the order of magnitude between 50 and 200 $\mu$m. This is possible mainly because the polycrystalline silicon can be etched substantially more precisely than metal because of the lesser amount of underetching. Since the polycrystalline silicon layer serves as the doping substance for the emitter zone 4, adjustment errors which necessitate corresponding tolerances if metal electrodes are used, are eliminated. During the fabrication of the thyristor according to FIG. 2, the emitter zones must be generated before the polycrystalline silicon layer is applied, since the auxiliary emitter contacts must form a shunt to the base zone 2. The path resistance in the contacts is kept small by doping the polycrystalline silicon. If the polycrystalline silicon layer is already doped very highly during the deposition, the amount of doping substance penetrating into the emitter zones 4 is determined by its solubility in the semiconductor body 1. Very uniform doping conditions can be generated in this manner.

I claim:
1. Power thyristor, comprising:
A semiconductor body having first and second main surfaces, said first main surface being planar;
an emitter zone being embedded in a planar manner, in said first main surface;
at least first and second metal electrodes disposed at least on said main surface;
said first electrode having a contact surface lying in a first plane parallel to said first main surface;
said second electrode having a contact surface lying in a second plane parallel to said first main surface;
said contact surface of said first electrode being further from said main surface than said contact surface of said second electrode;
said first electrode being formed of first and second layers and said second electrode being formed of a metal with a given thickness;
said first layer being adjacent said first main surface and being formed of polycrystalline silicon; and said second layer being disposed on said first layer and being formed of the same metal with the same given thickness as said second electrode.

2. Power thyristor according to claim 1, wherein said metal is aluminum.

3. Power thyristor according to claim 1, including a polyimide insulating layer covering said first main surface, covering said second electrode, and surrounding said first electrode except for said contact surface of said first electrode.

4. Power thyristor according to claim 1, wherein said first electrode is in the form of a plurality of mutually spaced apart coherent fingers and a portion of said second electrode is disposed between said fingers.

5. Power thyristor according to claim 1, wherein said first electrode is formed of a multiplicity of mutually separated island-shaped regions.

6. Power thyristor according to claim 1, wherein said polycrystalline silicon layer is doped.

7. Power thyristor according to claim 6, including an emitter zone, said polycrystalline silicon layer being a dopant source for the emitter zone.

* * * * *